(12) United States Patent
Poonjolai et al.

(10) Patent No.: US 8,207,057 B2
(45) Date of Patent: Jun. 26, 2012

(54) MICROBALL ASSEMBLY METHODS, AND PACKAGES USING MASKLESS MICROBALL ASSEMBLIES

(75) Inventors: Erasenthiran Poonjolai, Chandler, AZ (US); Lakshmi Supriva, Arlington, MA (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 12/317,587

(22) Filed: Dec. 23, 2008

(65) Prior Publication Data

US 2010/0155923 A1 Jun. 24, 2010

(51) Int. Cl.
*H01L 21/44* (2006.01)

(52) U.S. Cl. ........ 438/613; 438/119; 438/466; 438/614; 257/690; 257/737; 257/738; 257/780; 257/E21.327; 257/E21.508; 257/E21.514; 257/E23.023; 385/88; 29/846

(58) Field of Classification Search .................. 438/613, 438/614, 644; 257/690, 737, 738, 780; 385/88; 29/846

See application file for complete search history.

(56) References Cited

U.S. PATENT DOCUMENTS

| | | | | |
|---|---|---|---|---|
| 5,573,859 A | * | 11/1996 | Suppelsa | 428/553 |
| 2002/0050061 A1 | * | 5/2002 | Komyoji et al. | 29/846 |
| 2002/0106832 A1 | * | 8/2002 | Hotchkiss et al. | 438/108 |
| 2005/0106329 A1 | * | 5/2005 | Lewis et al. | 427/457 |
| 2009/0166396 A1 | * | 7/2009 | Supriya et al. | 228/179.1 |

\* cited by examiner

*Primary Examiner* — A. Sefer
*Assistant Examiner* — Farid Khan
(74) *Attorney, Agent, or Firm* — Winkle, PLLC

(57) ABSTRACT

A method of forming a microball grid array includes adhering a microball precursor material to a transfer medium under conditions to reflect a selective charge pattern. The method includes transferring the microball precursor material from the transfer medium across a gap and to an integrated circuit substrate under conditions to reflect the selective charge pattern. The method includes achieving the microball grid array without the aid of a mask.

19 Claims, 6 Drawing Sheets

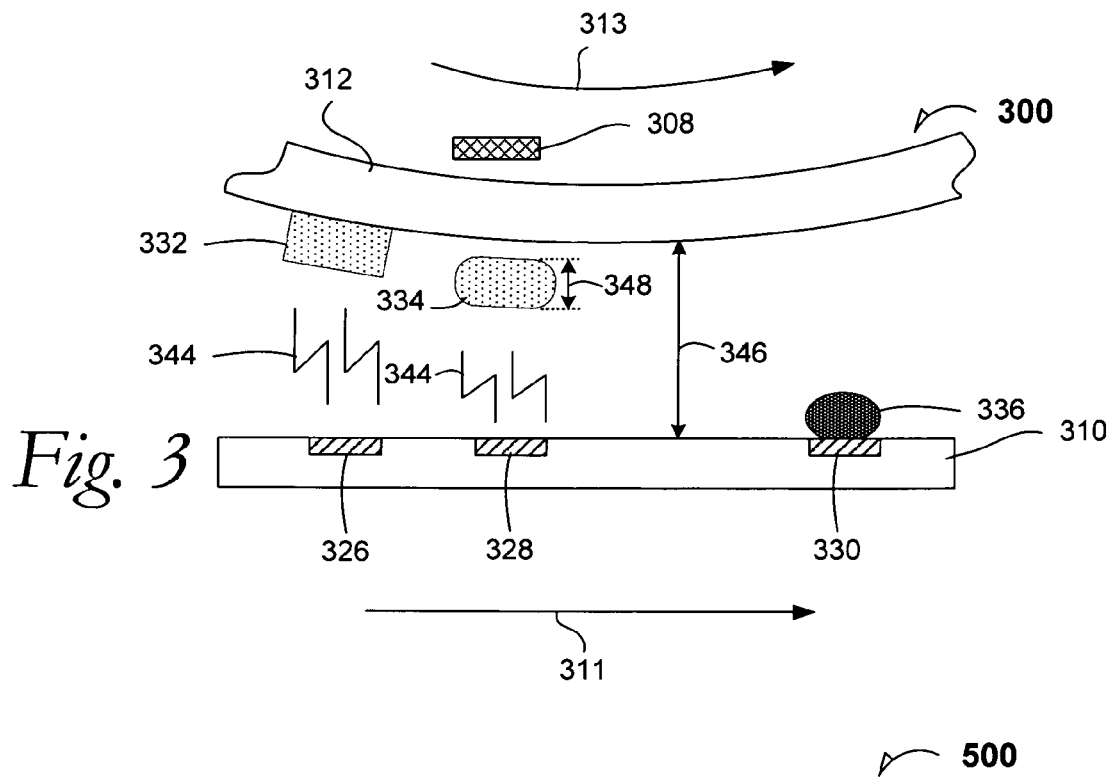
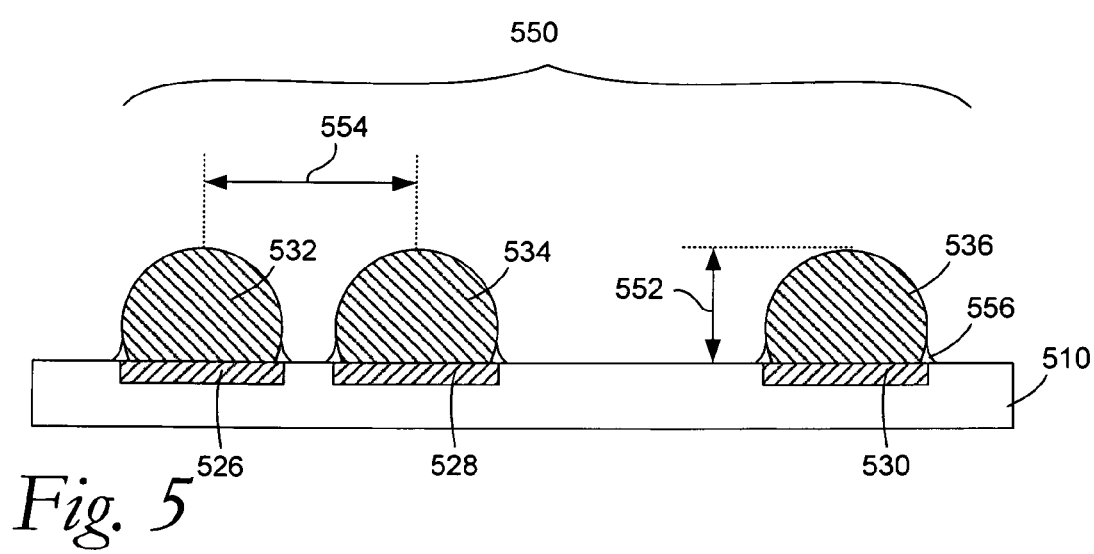

US 8,207,057 B2

MICROBALL ASSEMBLY METHODS, AND PACKAGES USING MASKLESS MICROBALL ASSEMBLIES

TECHNICAL FIELD

Disclosed embodiments relate to semiconductor substrates and wafers and methods of assembling microball arrays.

BACKGROUND

The stencil mask printing technique is widely used for fine-pitch ball grid substrate solder bumping of high-density interconnect substrates of electronic packages and also wafer and die level bumping. The technique has limitations as package sizes continue to decline. For example, printing at ultra-fine pitches such as less than 150 micrometers causes unacceptable yields since problems like mask lift-off and missing bumps often are the result. Other problems include getting a mask that can manage bump size and extra fine pitch that does not compromise the physical integrity of the mask. Other problems include cleaning mask equipment with increasingly smaller ball size and pitch. Additionally, low-volume solder bumps can occur with the technique that can result in over-burdened electrical connections during ordinary usage.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 3 is a schematic cross-section elevation of a microball selective depositing method during processing according to an example embodiment;

FIG. 5 is a cross-section elevation of a microball grid array on a semiconductor substrate according to an example embodiment;

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Figure 1:
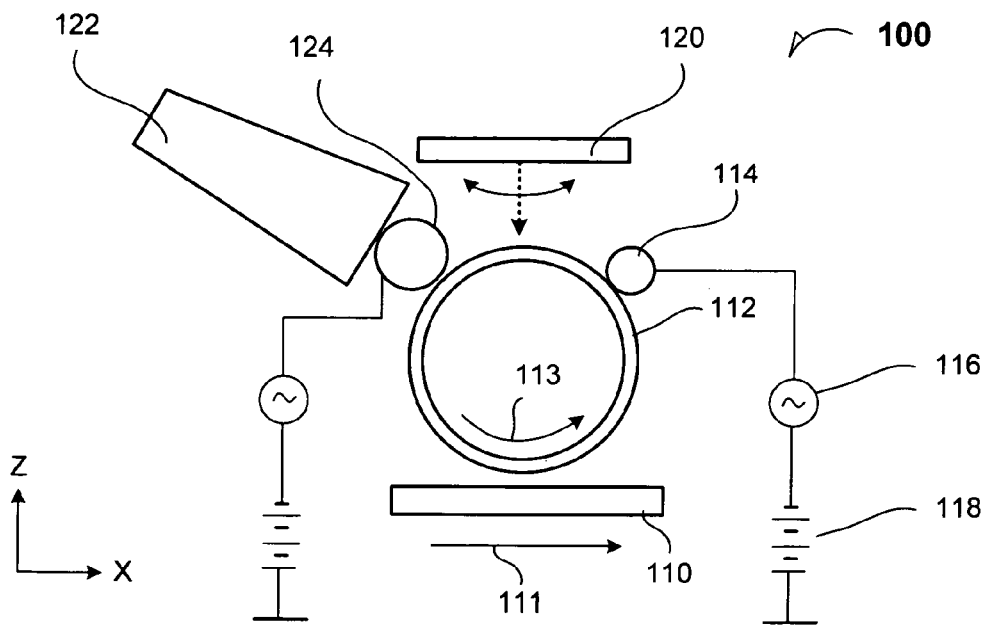
FIG. 1 is a schematic view of a microball selective depositing system according to an example embodiment.

FIG. 1 is a schematic view of a microball selective depositing system 100 according to an example embodiment. A semiconductor substrate 110 has been inserted into the microball selective depositing system 100 for processing. In an embodiment, the semiconductor substrate 110 is a semiconductive substrate such as a wafer or at least two unsingulated dice. In an embodiment, the semiconductor substrate 110 is a semiconductive substrate such as a single die. In an embodiment, the semiconductor substrate 110 is a die mounting substrate such as a printed wiring board.

A transfer medium 112 such as a photoconductor drum 112 is depicted rotating 113 in a counter-clockwise direction, and the semiconductor substrate 110 is depicted translating 111 from left-to-right synchronous with the rotating 113 photoconductor drum 112. A charging structure 114 such as a roller is disposed near the photoconductor drum 112 and an alternating current (AC) bias 116 that is augmented with a direct-current (DC) bias 118 imposes a blanket electrostatic charge onto the photoconductor drum 112.

In an embodiment, the blanket electrostatic charge is a charge of a first type such as a positive charge. During processing, a radiant-energy scanner 120 such as a laser image scanner 120 directs cohesive light onto the photoconductor drum 112 such that the blanket electrostatic charge of the first type is selectively altered to a selectively located charge of a second type such as neutral charge. In an embodiment, a laser image scanner 120 selectively alters the electrostatic charge of the first type to reflect a microball grid array pattern (see, e.g. FIGS. 4a and 4b). Consequently, the microball grid array pattern retains selective electrostatically charged sites.

A microball precursor cartridge 122 holds microball precursor materials. A microball precursor transfer unit 124 such as a developing roller and magnet 124 draws microball precursor materials from the microball cartridge 122 and presents them near the photoconductor drum 112 after the electrostatically configured microball array pattern has been established. In an embodiment, the developing roller and magnet 124 imposes an electrostatic charge on the microball precursor materials such that as they are presented near the photoconductor drum 112, the microball precursor materials are attracted to the photoconductor drum 112 in a manner that reflects the electrostatically configured microball grid array pattern.

In a method embodiment, the microball precursor materials transfer to the photoconductor drum 112 to form a microball grid array.

In further processing, the method includes presenting the microball precursor materials defined in the microball grid array near the semiconductor substrate 110 under conditions to cause the microball precursor materials to be drawn electrostatically across a gap between the transfer medium 112 and the semiconductor substrate 110.

In an embodiment, the microball precursor materials are solder powders. In an embodiment, the microball precursor materials are lead-containing solders. In an embodiment, the microball precursor materials are tin-indium containing solders. In an embodiment the solder is a eutectic mixture. In an embodiment, the microball precursor materials include an electromagnetic carrier such as and organic material this is imbued with the microball precursor materials. The electromagnetic carrier accepts an electrostatic charge. In an embodiment, the organic carrier material is a composition such as a polyaniline or a derivative thereof. In an embodiment, the organic carrier material is a composition such as a polyacetlyene or a derivative thereof. In an embodiment, the organic carrier material is a composition such as a polypyrrole or a derivative thereof. In an embodiment, the organic carrier material is a binding or linking composition such a disulfide or a derivative thereof. In an embodiment, the organic carrier material is a binding or linking composition such an alkanethiol or a derivative thereof. In an embodiment, the organic carrier material is a binding or linking composition such an alkylamine or a derivative thereof. In an embodiment, the organic carrier material is a binding or linking composition such an alkoxysilane or a derivative thereof.

Figure 2A:
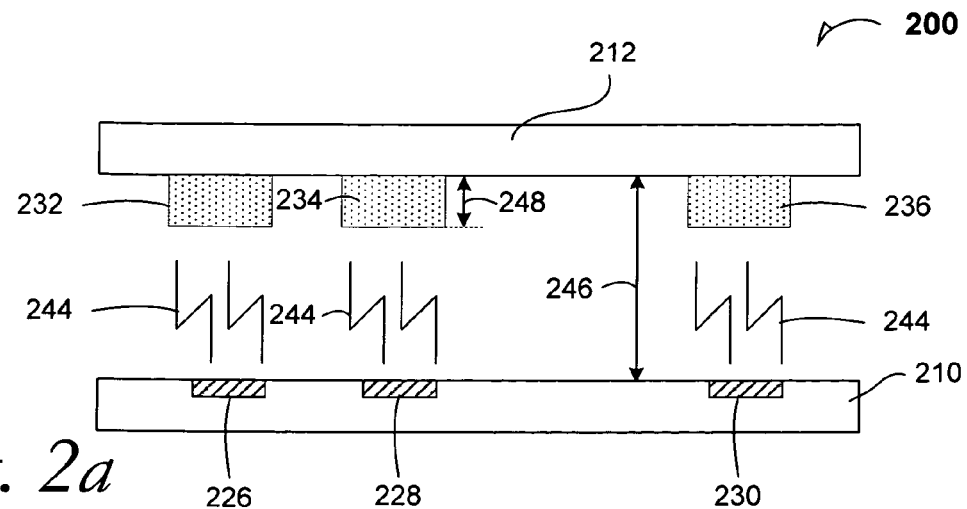
FIG. 2a is a schematic cross-section elevation of a microball selective depositing method during processing according to an example embodiment.

FIG. 2a is a schematic cross-section elevation of a microball selective depositing method 200 during processing according to an example embodiment. A semiconductor substrate 210 and a transfer medium 212 are depicted in detail subsection. In an embodiment, the semiconductor substrate 210 is a semiconductive die 210 with selectively located bond pads 226, 228, and 230. The transfer medium 212 has been blanket electrostatically charged by a charging structure and selectively patterned by a radiant-energy scanner. The transfer medium 212 has subsequently been exposed to a microball precursor transfer unit and microball precursors 232, 234, and 236 have adhered to the transfer medium 212 to reflect a microball grid array pattern.

Electrostatic lines of force 244 are depicted conceptually such that an attractive force 244 is developing between the microball precursors 232, 234, 236 and the semiconductor substrate 210.

In an embodiment, spacing 246 between the semiconductor substrate 210 and the transfer medium 212 is measured as a factor of microball precursor height 248. The spacing 246 and the microball precursor height 248 are depicted in FIG. 2a in arbitrary relative proportions. In an embodiment, spacing 246 is in a range from 1.1 times the microball precursor height 248 to 10 times the microball precursor height 248. In an embodiment, spacing 246 is in a range from 1.5 times the microball precursor height 248 to 3 times the microball precursor height 248. In any event, where the microball precursor is electrostatically drawn across a gap, it is understood the microball precursor achieves a free-body state during the transfer.

In an embodiment, the microball precursor height 248 is in a range from 10 nanometer (nm) to 120 micrometer (μm). In an embodiment, a microball will have been reflowed (e.g. see FIG. 5) with a height range from 10 nm to 120 μm. For a microball with a height of 10 nm, the pitch is about 12 nm.

In an embodiment, a reflowed microball has a height range from 10 nm to 150 μm and a pitch in a range from 12 nm to 150 μm. In an embodiment, a reflowed microball has a height of 100 μm and is configured in a microball grid array with a 130 μm pitch. In an embodiment, a reflowed microball has a height of 60 μm and is configured in a microball grid array with an 80 μm pitch.

Figure 2B:
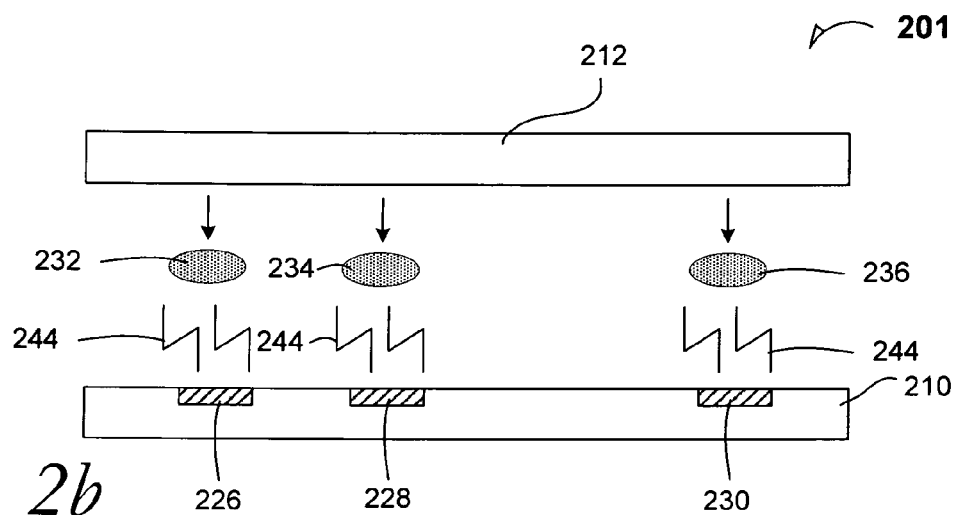
FIG. 2b is a continuation of the microball selective depositing method depicted in FIG. 2a after further processing according to an embodiment.

FIG. 2b is a continuation of the microball selective depositing method depicted in FIG. 2a after further processing according to an embodiment. The method 201 illustrates the conceptual electrostatic lines of force 244. The microball precursors 232, 234, 236 (FIG. 2a) have detached and are represented as each having achieved a free-body status as they are bridging a gap that is the spacing 246. In an embodiment, the free-body status of the microball precursors 232, 234, 236 includes the microball precursors 232, 234, 236 being drawn through a fluid-filled ambient such as air. In an embodiment, the fluid-filled ambient if present is a non-reactive gas with respect to the microball precursors 232, 234, 236. In an embodiment, the spacing 246 is a gap with a substantial vacuum or a micro atmosphere.

In an embodiment, the method of electrostatically drawing the microball precursors 232, 234, 236 across the gap is done in a gravitational field such that the direction of movement of the microball precursors 232, 234, 236 is the direction of the gravitational field. In an embodiment, a method is used to electrostatically drawing the microball precursors 232, 234, 236 across the gap in a micro gravitational field. In an embodiment, a method is used to electrostatically drawing the microball precursors 232, 234, 236 across the gap against a gravitational field. In an embodiment, a method is used to electrostatically drawing the microball precursors 232, 234, 236 across the gap in a 1 G gravitational field, but without regard to the direction of the 1 G gravitational field.

Figure 2C:
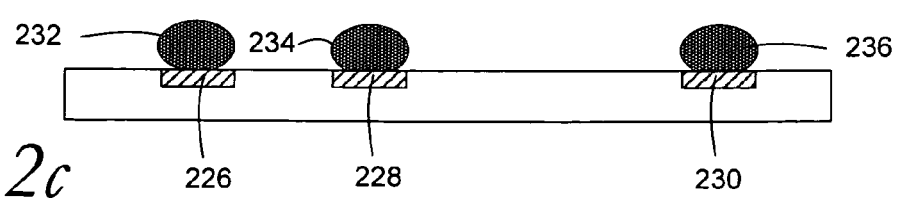
FIG. 2c is a continuation of the microball selective depositing method depicted in FIG. 2b after further processing according to an embodiment.

FIG. 2c is a continuation of the microball selective depositing method depicted in FIG. 2b after further processing according to an embodiment. The method 202 illustrates microball precursors 232, 234, 236 having landed upon the semiconductor substrate 210. The microball precursors 232, 234, 236 are seen to settle along the semiconductor substrate 210 to form a spaced-apart microball array.

FIG. 3 is a schematic cross-section elevation of a microball selective depositing method 300 during processing according to an example embodiment. A semiconductor substrate 310 has been inserted into the microball selective depositing system 300 for processing. The semiconductor substrate 310 is depicted with selectively located bond pads 326, 328, and 330.

A transfer medium 312 such as a photoconductor drum 312 is depicted rotating 313 in a counter-clockwise direction, and the semiconductor substrate 310 is depicted translating 311 from left-to-right synchronous with the rotating 313 photoconductor drum 312.

The method illustrates dynamic electrostatic transfer of microball precursors 332, 334, and 336. The microball precursor 332 is adhered to the photoconductor drum 312 but it is being attracted electrostatically as illustrated by the conceptual lines of electrostatic force 344. The microball precursor 334 is in a free-body state as it is closer to the semiconductor substrate 310 and the electrostatic lines of force 344 are drawing the microball precursor 334 across a gap 346 between the photoconductor drum 312 and the semiconductor substrate 310. The microball precursor 334 is depicted having detached from the photoconductor drum 312 at a location where the photoconductor drum 312 is closest to the semiconductor substrate 310. As a consequence, the electrostatic attraction is sufficient to dislodge the microball precursor 334 from the photoconductor drum 312, but the microball precursor 332 is not yet close enough to be dislodged.

In an embodiment, a charge altering device 308 is positioned at the nadir of the photoconductor drum 312 and is used to assist each microball precursor that is rotating closest to the semiconductor substrate 310 to release from the photoconductor drum 312. In an embodiment, a positively charged microball precursor 334 has been changed in charge by the charge altering device 308 and attraction to the semiconductor substrate 310 exceeds a threshold such that the microball precursor 334 becomes a free body.

The microball precursor 336 is depicted as having landed on the semiconductor substrate 310 after having just completed crossing the gap 346.

Figure 4A:
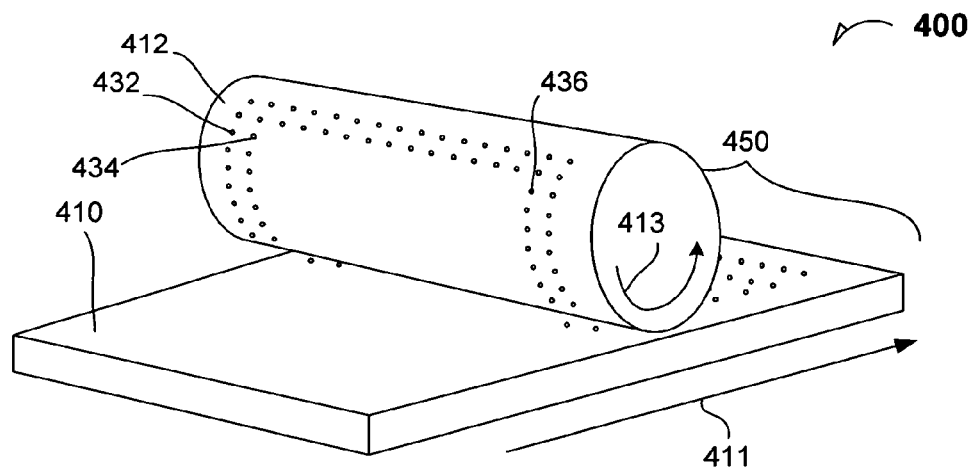
FIG. 4a is a perspective view of a portion of a microball selective depositing apparatus during a method of selectively forming a microball grid array on a substrate according to an example embodiment.

FIG. 4a is a perspective view of a portion of a microball selective depositing apparatus 400 during a method of selectively forming a microball grid array on a substrate according to an example embodiment. A semiconductor substrate 410 is illustrated with a photoconductor drum 412 being placed near the semiconductor substrate 410. The photoconductor drum 412 is rotating 413 in a counterclockwise manner and the semiconductor substrate 410 is translating 411 synchronous with the photoconductor drum 412. The photoconductor drum 412 and the semiconductor substrate 410 are separated by a gap, however, that is measured according to any gap-precursor size embodiments set forth in this disclosure.

A plurality of microball precursors are adhered to the photoconductor drum 412, three of which are designated with reference numerals 432, 434, and 436. The semiconductor substrate 410 also exhibits a plurality of landed microball precursors, which are disposed on a microball grid array 450.

Figure 4B:
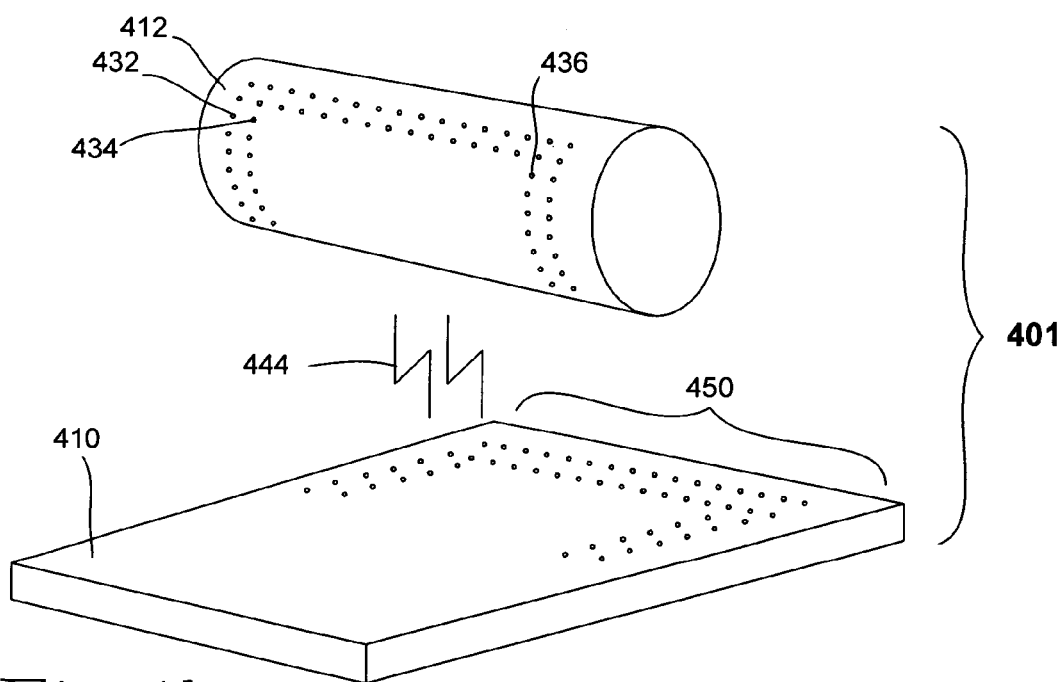
FIG. 4b is an expanded perspective view of a portion of a microball selective depositing apparatus during a method selectively of forming a microball grid array on a substrate according to an example embodiment.

FIG. 4b is an expanded perspective view of a portion of a microball selective depositing apparatus 400 during a method of selectively forming a microball grid array on a substrate according to an example embodiment. The photoconductor drum 412 and the semiconductor substrate 410 are separated to show electromagnetic lines of force 444 that attract the plurality of microball precursors 432, 434, and 436 that are adhered to the photoconductor drum 412. The microball grid array 450 is seen as being developed by transference of the microball precursors from the photoconductor drum 412 to the semiconductor substrate 410.

Reflow processing is carried out to form the microball grid array 450. In an embodiment, reflow processing is carried out such that organic carrier material is driven off, but a residue remains. In an embodiment, a charge carrier is imbued with a solder powder and the solder powder and charge carrier constitute the microball precursor material. In an embodiment the microball precursor material contains solder in a range from 20 percent solder powder to 90 percent solder powder. In an embodiment the solder powder has an average particle size in a range from 20 nanometer (nm) to 100 nm. In an embodiment, the solder powder is a lead-containing solder. In an embodiment, the solder powder is a tin-indium containing solder. In an embodiment, the solder powder is an indium-containing solder. In an embodiment, the solder powder is a tin-silver containing solder. In an embodiment, the solder powder is a copper-containing solder.

For each of the solder powder embodiments, the size range may be in the 20 nm to 100 nm range. For each of the solder powder embodiments, the size range may be larger than the 20 nm to 100 nm range, but in any event, the solder powder size in the microball precursor material is limited by the ultimate size of the microball to be formed.

FIG. 5 is a cross-section elevation of a package 500 that contains a microball grid array 550 on a semiconductor substrate 510 according to an example embodiment. The semiconductor substrate 510 includes bond pads, three of which are enumerated as bond pad 526, bond pad 528, and bond pad 530. Solder balls 532, 534, and 536 have been formed by a selective deposition embodiment. The microball grid array 550 has solder balls with a height 552 and a pitch 554 according to any of the disclosed embodiments. In an embodiment where the microball grid array 550 is formed with the use of an organic charge carrier, the microball grid array 550 exhibits a charge-carrier residue 556 that may settle near the conjunction of the microball 536 and the corresponding bond pad 530. The charge-carrier residue 556 may result from reflow conditions that do not volatilize all of the organic charge-carrier material.

In an embodiment, the semiconductor substrate 510 is a semiconductive die. In an embodiment, the semiconductor substrate 510 is a semiconductive die. In an embodiment, the semiconductor substrate 510 is a die mounting substrate such as a printed wiring board.

Figure 6:
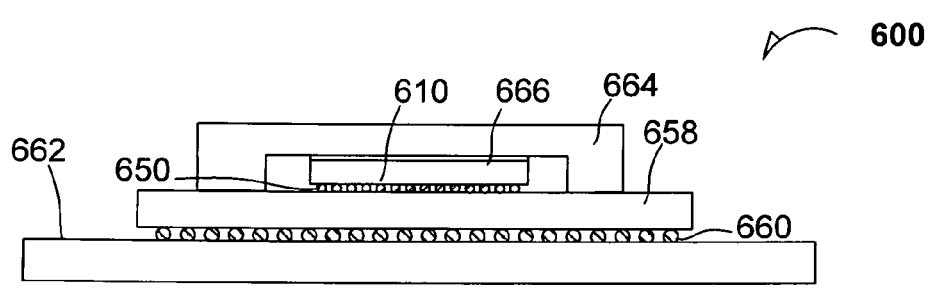
FIG. 6 is a cross-section elevation of a microball grid array package according to an example embodiment.

FIG. 6 is a cross-section elevation of a microball grid array package 600 according to an example embodiment. A first semiconductor substrate 610 is a die 610 and a microball grid array 650 is disposed between the die 610 and a second semiconductor substrate 658, which is a mounting substrate 658 such as a level-1 board. In an embodiment, the second semiconductor substrate 658 is an outer structure such as a shell for a hand-held microelectronic device. FIG. 6 also shows an embodiment with a microball grid array 660 that has been selectively deposited onto a board 662 according to a method embodiment. In an embodiment, the first semiconductor substrate 610 is a die 610 that acts as a processor for the package 600 and cooling is facilitated by a heat spreader 664 such as an integrated heat spreader. The heat spreader 664 and the die 610 are coupled with a thermal interface material (TIM) 666.

Figure 7:
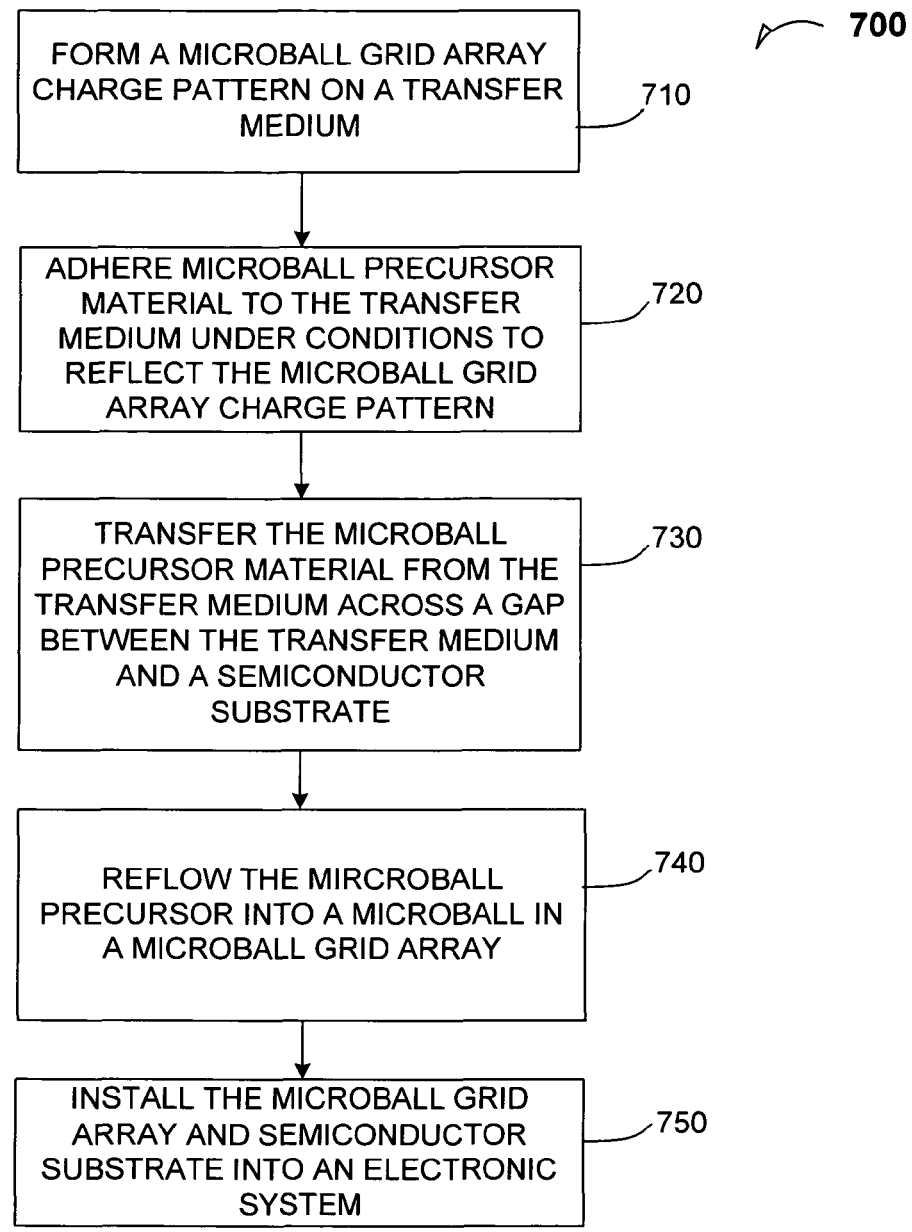
FIG. 7 is a method flow diagram according to an embodiment.

FIG. 7 is a method flow diagram according to an embodiment.

At 710, the method includes forming a microball grid array charge pattern on a transfer medium. In a non-limiting example, a charge roller 114 imposes a blanket electrostatic charge onto a photoconductor drum 112, and a laser image scanner 120 directs cohesive light onto the photoconductor drum 112 to alter the blanket charge.

At 720 the method includes adhering microball precursor material to the transfer medium under conditions to reflect the microball grid array charge pattern. In a non-limiting example, microballs 332, 334, and 336 adhere to a photoconductor drum 312.

At 730, the method includes transferring the microball precursor material from the transfer medium to an integrated circuit substrate under conditions to reflect the grid array charge pattern. In a non-limiting example, a microball precursor 334 transfers across a gap 346 onto a semiconductor substrate 310. It can now be appreciated that the method embodiments achieve a microball grid array transfer without the aid of a mask. In a nonlimiting example a charge-altering device 308 alters the charge one a microball precursor 334 such attraction to a semiconductor substrate 310 exceeds an adhesion threshold to a transfer medium 312, and the microball precursor 334 becomes a free body. In a method embodiment, yield is 100% successful transfer of each microball precursor from a transfer medium to a semiconductor substrate. In an embodiment, the method commences at 710 and terminates at 730.

At 740, the method includes reflowing the microball precursors to form a microball grid array. In an embodiment, the method commences at 710 and terminates at 740.

At 750, the method includes installing the microball grid array and semiconductor substrate into an electronic system. In a non-limiting example embodiment, a microball grid array 650 that has been selectively deposited onto a semiconductor substrate 610 such as a microprocessor according to a method embodiment is installed into an electronic system 600. In an embodiment, the method commences at 710 and terminates at 750.

Figure 8:
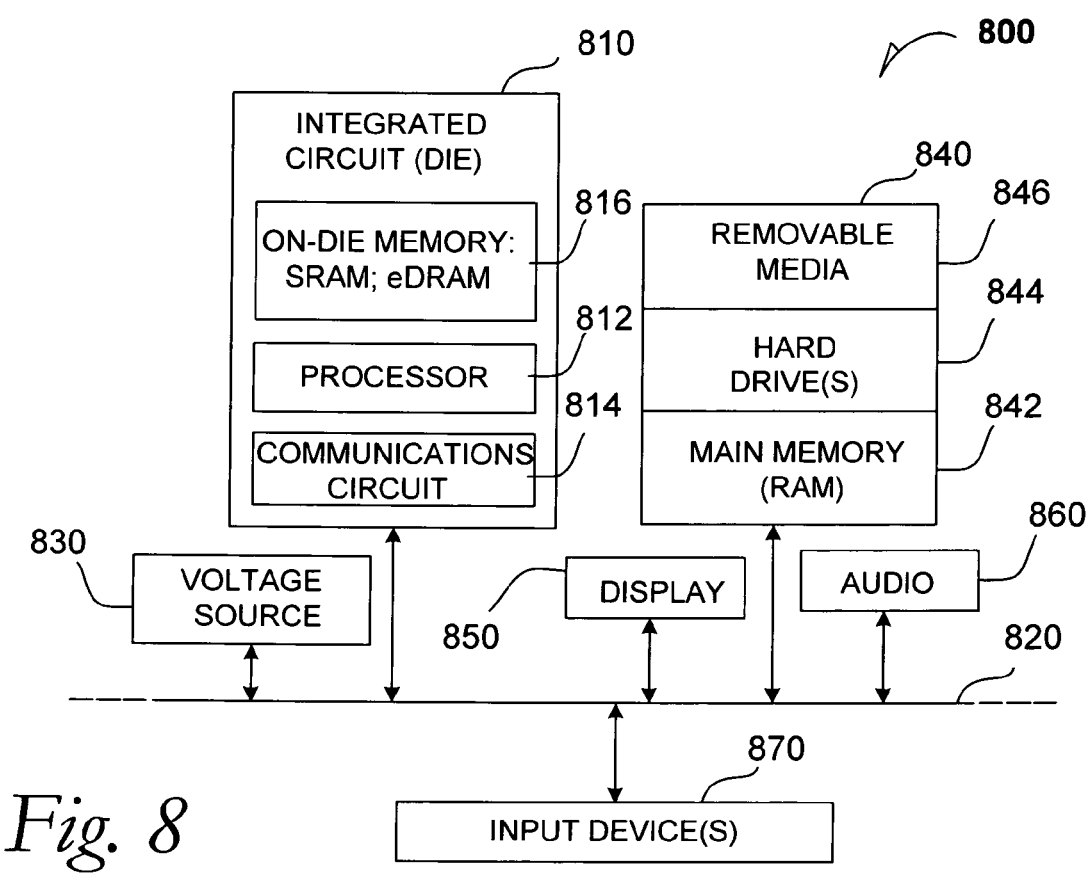
FIG. 8 is a schematic of an electronic system according to an embodiment.

FIG. 8 is a schematic of an electronic system 800 according to an embodiment. The electronic system 800 as depicted can embody a microball grid array that has been formed by any selective deposition method embodiment as set forth in this disclosure. In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. Other types of circuits that can be included in the integrated circuit 810 are a custom circuit or an application-specific integrated circuit (ASIC), such as a communications circuit 814 for use in wireless devices such as cellular telephones, pagers, portable computers, two-way radios, and similar electronic systems. In an embodiment, the processor 810 includes on-die memory 816 such as static random-access memory (SRAM). In an embodiment, the processor 810 includes embedded on-die memory 816 such as embedded dynamic random-access memory (eDRAM).

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory keys, and other removable media known in the art.

In an embodiment, the electronic system 800 also includes a display device 850, an audio output 860. In an embodiment, the electronic system 800 includes a controller 870, such as a keyboard, mouse, trackball, game controller, microphone, voice-recognition device, or any other device that inputs information into the electronic system 800.

As shown herein, the integrated circuit 810 can be implemented in a number of different embodiments, including a microball grid array that has been formed by any selective deposition method embodiment, an electronic system, a computer system, one or more methods of fabricating an integrated circuit, and one or more methods of fabricating a microball grid array that has been formed by any selective deposition method embodiment as set forth herein in the various embodiments and their art-recognized equivalents. The elements, materials, geometries, dimensions, and sequence of operations can all be varied to suit particular I/O coupling requirements including array contact count, array contact configuration, such as single-edge, double-edge, triple-edge, and all four edges being occupied by a microball grid array that has been formed by any selective deposition method embodiment.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method of forming a microball, comprising electrostatically drawing a microball precursor across a gap from a transfer medium to a semiconductor substrate to form a microball in a microball array, wherein the microball precursor achieves a free-body status in the gap, and wherein drawing the microball precursor is done with an electromagnetic carrier that is imbued with the microball precursor, and wherein the microball precursor is a metallic particulate mass.

2. The method of claim 1, wherein electrostatically drawing the microball precursor across the gap is carried without the aid of a mask.

3. The method of claim 1, wherein electrostatically drawing the microball precursor across a gap includes a fluid-filled ambient.

4. The method of claim 1, wherein electrostatically drawing the microball precursor is assisted in a gravitational field.

5. The method of claim 1, wherein the microball precursor settles onto the semiconductor substrate to form part of a spaced-apart microball array that has a microball diameter in a range from 30 micrometer (μm) to 150 μm and a pitch in a range from 50 μm to 150 μm.

6. The method of claim 1, wherein the microball precursor settles onto the semiconductor substrate to form part of a spaced-apart microball array that has a microball diameter in a range from 10 nanometer (nm) to 150 micrometer (μm) and a pitch in a range from 12 nm to 150 μm.

7. A method of assembling microballs, comprising:
    forming a microball grid array charge pattern on a transfer medium;
    adhering microball precursor material to the transfer medium under conditions to reflect the microball grid array charge pattern;

transferring the microball precursor material from the transfer medium to an integrated circuit substrate under conditions to reflect the microball grid array charge pattern; and
reflowing the microball precursor material under conditions to allow electromagnetic carrier material mingled with the microball precursor material to form a residue adherent to the microball.

8. The method of claim 7, wherein transferring the microball precursor material from the transfer medium to the integrated circuit substrate is carried without the aid of a mask.

9. The method of claim 7, wherein forming the microball grid array charge pattern on a transfer medium includes:
imposing a blanket charge of a first type on the transfer medium; and
selectively altering the blanket charge of the first type on the transfer medium to form microball grid array charge pattern.

10. The method of claim 7, wherein transferring the microball precursor material includes electrostatically drawing the microball precursor material across a gap between the transfer medium and the semiconductor substrate to form a microball array, wherein the microball precursor achieves a free-body status while in the gap.

11. The method of claim 7, further comprising reflowing the microball precursor material.

12. The method of claim 7, wherein forming the microball grid array charge pattern on the transfer medium includes:
forming a first electrical charge on the transfer medium; and
canceling the first electrical charge on the transfer medium to reflect the microball grid array charge pattern.

13. The method of claim 7, wherein adhering microball precursor material to the transfer medium under conditions to reflect the microball grid array charge pattern includes:
forming a first electrical charge on the transfer medium;
canceling the first electrical charge on the transfer medium to reflect the microball grid array charge pattern;
forming a second charge on the microball precursor material that is different from the first charge; and
interfacing the microball precursor material with the transfer medium.

14. The method of claim 7, wherein transferring the microball grid array charge pattern from the transfer medium to the integrated circuit substrate includes:
forming a first electrical charge on the transfer medium;
canceling the first electrical charge on the transfer medium to reflect the microball grid array charge pattern;
forming a second charge on the microball precursor material that is different from the first charge;
interfacing the microball precursor material with the transfer medium;
imposing a third charge on the integrated circuit substrate that is different from the second charge; and
interfacing the transfer medium with the semiconductor substrate.

15. A method of forming a microball, comprising:
forming a microball grid array charge pattern on a transfer medium;
adhering microball precursor material to the transfer medium under conditions to reflect the microball grid array charge pattern;
electrostatically drawing the microball precursor across a gap from the transfer medium to a semiconductor substrate to form a microball in a microball array, wherein the microball precursor achieves a free-body status in the gap, wherein electrostatically drawing includes transferring the microball precursor material from the transfer medium to an integrated circuit substrate under conditions to reflect the microball grid array charge pattern, and wherein drawing the microball precursor is done with an electromagnetic carrier that is imbued with the microball precursor, and wherein the microball precursor is a metallic particulate mass.

16. The method of claim 15, wherein the microball precursor settles onto the semiconductor substrate along to form part of a spaced-apart microball array that has a microball diameter in a range from 30 micrometer ($\mu$m) to 150 $\mu$m and a pitch in a range from 50 $\mu$m to 150 $\mu$m.

17. The method of claim 15, wherein transferring the microball precursor material from the transfer medium to the integrated circuit substrate includes:
forming a first electrical charge on the transfer medium;
canceling the first electrical charge on the transfer medium to reflect the microball grid array charge pattern;
forming a second charge on the microball precursor material that is different from the first charge;
interfacing the microball precursor material with the transfer medium;
imposing a third charge on the integrated circuit substrate that is different from the second charge; and
interfacing the transfer medium with the semiconductor substrate.

18. The method of claim 1, wherein the microball precursor settles onto the semiconductor substrate along to form part of a spaced-apart microball array that has a microball diameter in a range from 10 nanometer (nm) to 150 micrometer ($\mu$m) and a pitch in a range from 12 nm to 150 $\mu$m, the method further comprising reflowing the microball precursor material.

19. A method of forming a microball, comprising electrostatically drawing a microball precursor across a gap from a transfer medium to a semiconductor substrate to form a microball in a microball array, wherein the microball precursor achieves a free-body status in the gap, and wherein the microball precursor settles onto the semiconductor substrate along to form part of a spaced-apart microball array that has a microball diameter in a range from 10 nanometer (nm) to 150 micrometer ($\mu$m) and a pitch in a range from 12 nm to 150 $\mu$m, the method further comprising reflowing the microball precursor material under conditions to allow electromagnetic carrier material mingled with the microball precursor material to form a residue adherent to the microball.

* * * * *

UNITED STATES PATENT AND TRADEMARK OFFICE
CERTIFICATE OF CORRECTION

PATENT NO. : 8,207,057 B2
APPLICATION NO. : 12/317587
DATED : June 26, 2012
INVENTOR(S) : Erasenthiran Poonjolai et al.

It is certified that error appears in the above-identified patent and that said Letters Patent is hereby corrected as shown below:

On the Title page:

Item (75), in "Inventors", line 2, delete "Supriva" and insert -- Supriya --, therefor.

On sheet 5 of 6, in Figure 7, Box 740, line 1, delete "MIRCROBALL" and insert -- MICROBALL --, therefor.

Signed and Sealed this
Twenty-fifth Day of September, 2012

David J. Kappos
*Director of the United States Patent and Trademark Office*